United States Patent
Brunschwiler et al.

(10) Patent No.: US 8,021,710 B2
(45) Date of Patent: Sep. 20, 2011

(54) ELECTRONIC DEVICE HAVING AN ELECTRODE WITH ENHANCED INJECTION PROPERTIES

(75) Inventors: Thomas Brunschwiler, Thalwil (CH); Siegfried F. Karg, Adliswil (CH); Walter Riess, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 1176 days.

(21) Appl. No.: 11/205,232

(22) Filed: Aug. 16, 2005

(65) Prior Publication Data

US 2006/0038170 A1    Feb. 23, 2006

(30) Foreign Application Priority Data

Aug. 17, 2004  (EP) .................................. 04405511

(51) Int. Cl.
*B05D 5/12* (2006.01)
*C08F 2/46* (2006.01)
*C08F 2/48* (2006.01)

(52) U.S. Cl. ............ 427/58; 427/66; 427/487; 427/488; 427/508

(58) Field of Classification Search .................... 427/58, 427/66, 487, 488, 496, 497, 508, 509
See application file for complete search history.

(56) References Cited

U.S. PATENT DOCUMENTS

| | | | |
|---|---|---|---|
| 2001/0022497 A1* | 9/2001 | Aoki et al. | 313/507 |
| 2002/0018912 A1* | 2/2002 | Jung et al. | 428/690 |
| 2002/0146590 A1* | 10/2002 | Matsuo et al. | 428/690 |
| 2003/0030059 A1* | 2/2003 | Shi et al. | 257/79 |
| 2003/0229155 A1 | 12/2003 | Wang et al. | |
| 2004/0027059 A1* | 2/2004 | Tsutsui | 313/504 |
| 2004/0097101 A1 | 5/2004 | Kwong et al. | |

FOREIGN PATENT DOCUMENTS

| | | |
|---|---|---|
| WO | WO 0241414 | 5/2002 |
| WO | WO03056640 | 7/2003 |

* cited by examiner

*Primary Examiner* — James Lin
(74) *Attorney, Agent, or Firm* — Steven Chiu

(57) ABSTRACT

The present invention relates to methods and apparatus for producing an electronic device, such as an organic light-emitting diode (OLED), having an electrode with enhanced injection properties. An example method according to the invention comprises the steps of providing an electrode, depositing a first layer of molecular charge transfer material on the electrode, and cross-linking the molecular charge transfer material. With the method according to the invention, an OLED with higher light efficiency, lower operating voltage, and longer lifetime can be produced. The present invention further relates to an electronic device having an electrode with enhanced injection properties.

12 Claims, 4 Drawing Sheets

ELECTRONIC DEVICE HAVING AN ELECTRODE WITH ENHANCED INJECTION PROPERTIES

BACKGROUND OF THE INVENTION

The present invention relates to producing an electronic device, such as an organic light-emitting diode (OLED), having an electrode with enhanced injection properties. Further, the present invention relates to an electronic device comprising an electrode with enhanced injection properties.

Organic light emitting diodes (OLEDs) represent a promising technology for display applications or illumination applications. A typical light-emitting diode includes a substrate. On the substrate there is arranged a first electrode, which usually acts as a hole-injecting anode. On the anode there is provided a luminescent region comprising an organic electroluminescent material. At last, a second electrode, which is usually used as an electron-injecting cathode, is deposited on the organic electroluminescent material.

When a voltage is applied across the first and the second electrodes, electrons are injected from the cathode into the luminescent region and holes are injected from the anode to the luminescent region. The electrons and holes recombine in the luminescent region, so that light is emitted.

The known diodes could be subdivided into top emitting diodes and bottom emitting diodes. In top emitting diodes the generated light is reflected by the first electrode and emits through the transparent or substantially transparent second electrode. In bottom emitting diodes the generated light emits through the transparent or substantially transparent first electrode/substrate and is reflected by the second electrode.

In contrast to the conventional components being based on inorganic materials the advantage of the known devices containing organic materials consists in that it is possible to provide large-surface elements, like displays or screens. Further, due to their low process temperature in contrast to inorganic materials, these materials could be easily provided on flexible substrates, thereby being usable in a new set of applications for displays and screens.

However, compared to the light-emitting diodes based on inorganic materials, organic light-emitting diodes are operated with a higher operating voltage. This originates inter-alia from the fact that the injection of charge carriers, i.e. electrons or holes, from the electrodes into the organic layer is less efficient, i.e. the common organic light-emitting diodes do not have electrodes which exhibit ohmic or barrier-less injection.

In order to overcome the above-mentioned problem, i.e. to enhance the injection properties and reduce the operating voltage, WO 02/41414 A1 proposes to provide an organic light-emitting diode comprising the following features. First, there are provided two electrodes, i.e. a hole-injecting anode and an electron-injecting cathode. In contact to the electrodes there are provided layers of transport materials, i.e. a hole-transporting material (HTM) on the anode and an electron-transporting material (ETM) on the cathode. The HTM-layer and the ETM-layer are doped, i.e. the HTM-layer is p-doped (holes) and the ETM-layer is n-doped (electrons). On the HTM-layer and the ETM-layer, respectively, there are further provided blocking layers between which the emitter material (EM), which emits the light during recombination, is arranged.

Though the above-described arrangement is able to enhance the injection properties and to reduce the operating voltage, the enhancement of the injection properties and the reduction of the operating voltage are still not sufficient. Further, the lifetime of the known organic light-emitting diode is decreased, i.e. the diode is subjected to an accelerated ageing, which leads to a decrease of the luminosity of the emitter material (EM). Thus, already after a short running time the light emission efficiency is low.

SUMMARY OF THE INVENTION

It is therefore an aspect of the present invention to provide methods for producing an electronic device, especially an organic light-emitting diode, having an electrode with enhanced injection properties, so that a lower operating voltage, a higher light emission efficiency, and a longer lifetime can be achieved.

It is a further aspect of the present invention to provide an electronic device, especially an organic light-emitting diode, having an electrode with enhanced injection properties, so that a lower operating voltage, a higher light emission efficiency, and a longer lifetime can be achieved.

An example of a method for producing an electronic device having an electrode with enhanced injection properties according to the invention includes the following steps. First, a first electrode is provided. The first electrode may for example later be used as a cathode or an anode in the final electronic device. The first electrode, which will be used as an anode, may for example comprise an Indium-Tin-Oxide (ITO) layer, if used in a bottom-emitting diode, or an aluminium layer, if used in a top-emitting diode. The first electrode may be deposited on a transparent or non-transparent substrate, depending on the OLED to be produced. The first electrode, which will be used as a cathode, may for example comprise aluminium in combination with a thin layer of lithium fluoride, magnesium, calcium or a mixed layer of magnesium and silver. However, even other materials with appropriate work functions and reflectivity can be used as the first electrodes.

After providing the first electrode a layer of molecular charge transfer material is deposited on the first electrode. The molecular charge transfer material may for example comprise $F_4$-TCNQ, if the first electrode will be used as an anode, or TTF, if the first electrode will be used as a cathode. Whichever material is used, the depositing of the molecular charge transfer material may for example be performed by vacuum evaporation or any other suitable process which is able to generate a homogeneous layer of the molecular charge transfer material on the first electrode.

Then, the molecular charge transfer material is cross-linked in order to enhance the injection property of the first electrode. The cross-linking step may for example be performed by irradiating the molecular charge transfer material with an electron beam, so that a polymerization and cross-linking of the molecular charge transfer material takes place. The molecular charge transfer material does not need to be cross-linked as a whole, it is in fact sufficient to cross-link only a part of the material. However, it is most advantageous to cross-link the whole molecular charge transfer material. The cross-linking provides a higher thermal stability of the layer of molecular charge transfer material.

Another aspect of the invention is directed to providing the production of an organic light-emitting diode (OLED). An example method includes the following further steps. A second layer of molecular transfer material is deposited on the last organic layer, i.e. on that organic layer, which was the latest deposited on the first layer of cross-linked molecular charge transfer material. Then, the second layer of molecular transfer material is cross-linked as already mentioned above. At last a second electrode is deposited on the second layer of the cross-linked molecular transfer material. The deposition steps may be performed according to known techniques.

In another advantageous embodiment of the method according to the invention, the molecular charge transfer material includes an acceptor or a donor. Usually, if the first electrode will be used as an anode in the device to be produced, the molecular charge transfer material is an acceptor, if the first electrode will be used as a cathode in the device to be produced, the molecular charge transfer material is a donor.

According to a most advantageous embodiment of the electronic device of the invention, the device is an organic light-emitting diode (OLED) comprising the first and a second electrode having at least one organic layer deposited there between. Both electrodes may be treated by the method in accordance with the invention. One of said organic layers may for example consist of an electroluminescent material.

BRIEF DESCRIPTION OF THE DRAWINGS

The accompanying drawings, which are incorporated in and constitute a part of the specification, illustrate example embodiments of the invention, and together with the general description given above and the detailed description of the embodiments given below, serve to explain the principles of the invention, in which.

DETAILED DESCRIPTION OF THE INVENTION

Figure 1:
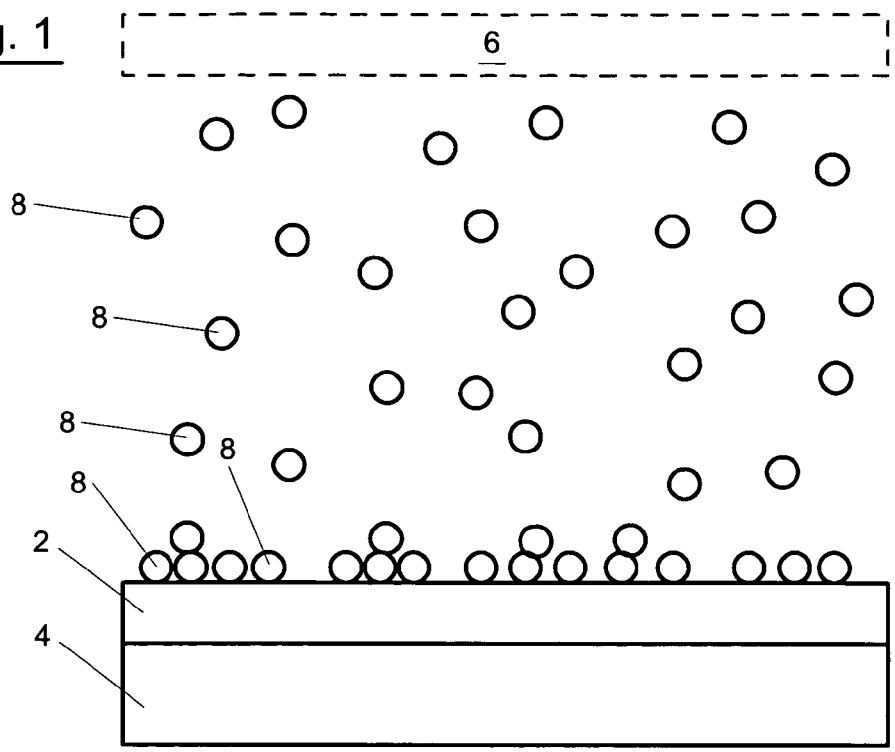
FIG. 1 is a schematic drawing illustrating the step of depositing a layer of molecular charge transfer material on an electrode according to the method of the invention.

The present invention provides methods for producing an electronic device, especially an organic light-emitting diode, having an electrode with enhanced injection properties, so that a lower operating voltage, a higher light emission efficiency, and a longer lifetime can be achieved. The present invention also provides an electronic device, especially an organic light-emitting diode, having an electrode with enhanced injection properties, so that a lower operating voltage, a higher light emission efficiency, and a longer lifetime can be achieved.

In an example embodiment, a method for producing an electronic device having an electrode with enhanced injection properties according to the invention includes the following steps. First, a first electrode is provided. The first electrode may for example later be used as a cathode or an anode in the final electronic device. The first electrode, which will be used as an anode, may for example comprise an Indium-Tin-Oxide (ITO) layer, if used in a bottom-emitting diode, or an aluminium layer, if used in a top-emitting diode. The first electrode may be deposited on a transparent or non-transparent substrate, depending on the OLED to be produced. The first electrode, which will be used as a cathode, may for example comprise aluminium in combination with a thin layer of lithium fluoride, magnesium, calcium or a mixed layer of magnesium and silver. However, even other materials with appropriate work functions and reflectivity can be used as the first electrodes.

After providing the first electrode a layer of molecular charge transfer material is deposited on the first electrode. The molecular charge transfer material may for example comprise $F_4$-TCNQ, if the first electrode will be used as an anode, or TTF, if the first electrode will be used as a cathode. Whichever material is used, the depositing of the molecular charge transfer material may for example be performed by vacuum evaporation or any other suitable process which is able to generate a homogeneous layer of the molecular charge transfer material on the first electrode.

Then, the molecular charge transfer material is cross-linked in order to enhance the injection property of the first electrode. The cross-linking step may for example be performed by irradiating the molecular charge transfer material with an electron beam; so that a polymerization and cross-linking of the molecular charge transfer material takes place. The molecular charge transfer material does not need to be cross-linked as a whole, it is in fact sufficient to cross-link only a part of the material. However, it is most advantageous to cross-link the whole molecular charge transfer material. The cross-linking provides a higher thermal stability of the layer of molecular charge transfer material.

In some embodiments, further procedure steps may follow. For example, if the device to be produced is an organic light-emitting diode (OLED), an organic layer of electroluminescent material may be placed on the cross-linked molecular charge transfer material and afterwards a second electrode with the same structure as mentioned above may be placed on the organic layer. The device may also be a transistor, a photovoltaic cell or any other device that uses an electrode which should have the advantages mentioned hereinafter.

Whichever device is produced with the method according to the invention, said device will have a first electrode with enhanced injection properties, so that a lower operating voltage can be used to operate said device. This is due to the fact that the injection properties, i.e. hole-injection or electron-injection, between the first electrode with the cross-linked molecular charge transfer material deposited thereon and a following layer is improved. If an organic light-emitting diode (OLED) is produced, the injection properties between the cross-linked molecular charge transfer material and the adjacent organic layer of emitter material is improved. In contrast to the known OLEDs, the molecules of the cross-linked molecular charge transfer material are reduced in their ability to migrate into the adjacent organic layer of electroluminescent material, so that the so-called quenching effect is reduced and the lifetime of the OLED and the light emission efficiency of the OLED is increased.

In an advantageous embodiment of the method according to the present invention the cross-linking of the molecular charge transfer material is performed by irradiating the molecular charge transfer material with an electron-beam, UV irradiation, plasma or ion beam. According to a further advantageous embodiment of the present invention the depositing and the cross-linking of the molecular charge transfer material are performed within one single step, i.e. the cross-linking is performed during the depositing of the molecular charge transfer material. For example, during the evaporation in order to deposit the molecular charge transfer material on the first electrode, the material on the first electrode and/or the material to be deposited on the first electrode may be irradiated with an electron-beam, UV irradiation, plasma or ion beam. This way, a time-saving method is provided, so that a higher number of devices can be produced in shorter time.

Even if most of the molecular charge transfer material is cross-linked, there may still remain some molecules in this layer, which are not cross-linked with the others. In an OLED for example, these molecules would tend to migrate into the adjacent organic layer of electroluminescent material, where they cause the so-called quenching causing an accelerated ageing and thus a lower intensity of light of the OLED. Therefore an advantageous embodiment of the method according to the invention further includes the step of annealing the cross-linked molecular charge transfer material. The annealing step which leads to an exhalation of the remaining loose molecules may for example be performed with a nitrogen atmosphere at a temperature of 450° C. If a second layer of molecular charge transfer material on top of a stack of layers is annealed, a lower temperature and application of a vacuum are preferred.

According to another advantageous embodiment of the invention at least one organic layer is deposited on the layer of the cross-linked molecular charge transfer material. One of said organic layers may for example consist of an electroluminescent material, like for example $Alq_3$. The deposition step may be performed according to known techniques.

Another advantageous embodiment according to the invention is directed to the production of an organic light-emitting diode (OLED) and includes the following further steps. A second layer of molecular transfer material is deposited on the last organic layer, i.e. on that organic layer, which was the latest deposited on the first layer of cross-linked molecular charge transfer material. Then, the second layer of molecular transfer material is cross-linked as already mentioned above. At last a second electrode is deposited on the second layer of the cross-linked molecular transfer material. The deposition steps may be performed according to known techniques.

In another advantageous embodiment of the method according to the invention, the molecular charge transfer material includes an acceptor or a donor. Usually, if the first electrode will be used as an anode in the device to be produced, the molecular charge transfer material is an acceptor, if the first electrode will be used as a cathode in the device to be produced; the molecular charge transfer material is a donor.

In a further advantageous embodiment of the method according to the invention, the acceptor includes one of $F_4$-TCNQ, TNF, TeNF, TCNQ, TN9(CN)2F, TCNB, TeClBQ, TeFTCNQ, DCNQI and TCAQ. In a further advantageous embodiment of the method according to the invention, the donor includes one of TTF, TTN, BEDT-TTF, Terpy, Ru(terpy)2 and crystal violet.

The electronic device having a first electrode with enhanced injection properties according to the invention includes a layer of a molecular charge transfer material deposited on the first electrode, the molecular charge transfer material being cross-linked or polymerized. The cross-linking may consist of a polymerisation of the monomers in combination with a cross-linking of the generated polymers.

In an advantageous embodiment of the electronic device according to the invention the cross-linked molecular charge transfer material is annealed.

According to a most advantageous embodiment of the electronic device in terms of the invention, the device is an organic light-emitting diode (OLED) comprising the first and a second electrode having at least one organic layer deposited there between. Both electrodes may be treated by the method in accordance with the invention. One of said organic layers may for example consist of an electroluminescent material.

According to a further advantageous embodiment of the invention the electronic device is a field effect transistor (FET), comprising the first and a second electrode, said electrodes being laterally displaced on a substrate. The first electrode may for example be the source electrode, and the second electrode may be the drain electrode.

FIGS. 1 to 4 show an advantageous embodiment of the method for producing an electronic device having an electrode with enhanced injection properties according to the invention. In a first step according to the method of the invention, there is provided a first electrode 2. Said first electrode 2 includes here a layer of aluminium being deposited on a substrate 4. The first electrode 2 will be used as an anode of the final device. The deposition of the aluminium on the substrate 4 could be performed by evaporation or any other process, which is able to create an aluminium layer on the substrate 4.

A second step of the method according to the invention is shown in FIG. 1. An evaporation source 6 is provided. The evaporation source 6 is used to deposit a first layer of molecular charge transfer material 8 on the first electrode 2. In an advantageous embodiment shown in FIGS. 1 to 4, the molecular charge transfer material 8 comprises an acceptor, said acceptor being $F_4$-TCNQ. As can be seen in FIG. 1, the molecular charge transfer material 8 is deposited on the first electrode 2 without having a strong connection between the deposited molecules, i.e. in other words, without any covalent bonds between the atoms of adjacent molecules.

Figure 2:
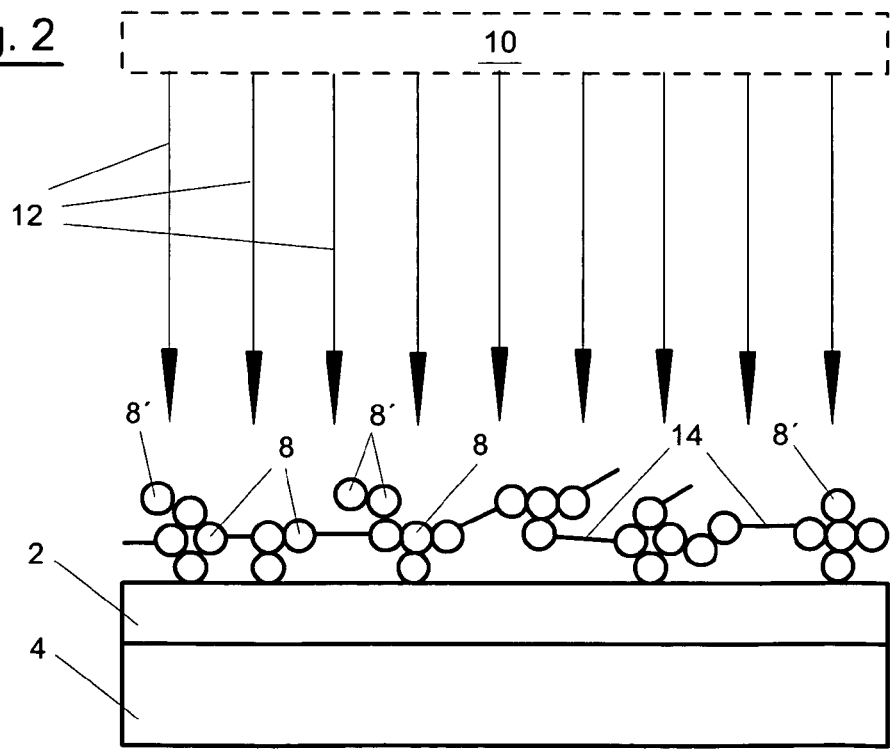
FIG. 2 is a schematic drawing illustrating the step of cross-linking the molecular charge transfer material shown in FIG. 1.

The next step according to the invention is shown in FIG. 2. After having deposited the molecular charge transfer material 8 on the first electrode 2, a radiation source 10 is provided. The radiation source 10 may for example radiate electron-beam, UV irradiation, plasma or ion beam. In the shown embodiment the radiation source 10 is an electron-beam source. The electron-beam, which is indicated by arrows 12 in FIG. 2, radiated by the radiation source 10 is directed to the molecular charge transfer material 8 deposited on the first electrode 2. Due to the irradiation the molecules of the molecular charge transfer material 8 are cross-linked which is shown in FIG. 2 by way of connecting bridges 14. The duration of the irradiation should be chosen according to the desired degree of cross-linking.

Figure 3:
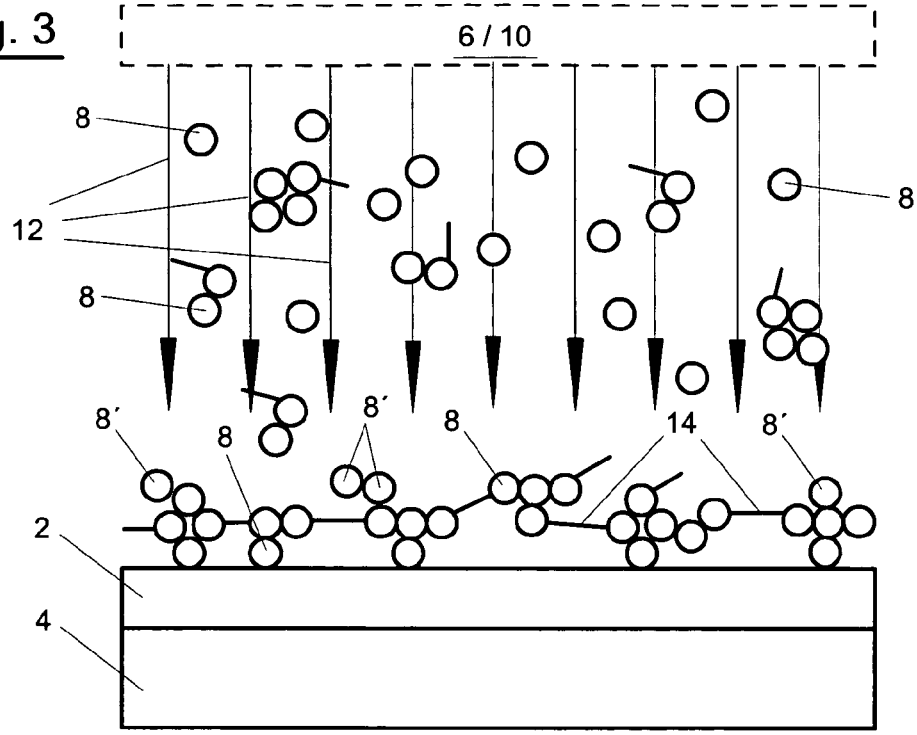
FIG. 3 is a schematic drawing illustrating an alternative embodiment of the method according to the invention, in which the depositing and the cross-linking of the molecular charge transfer material is performed within one single step.

In FIGS. 1 and 2. the steps of depositing and cross-linking the molecular charge transfer material 8 are performed successively. However, according to an advantageous embodiment, which is shown in FIG. 3, both steps are performed within one single step, i.e. the evaporation source 6 and the radiation source 10 are used in parallel, so that the molecular charge transfer material 8 is irradiated with the electron-beam 12 before and after the deposition on the first electrode 2. Thus, according to this advantageous embodiment a time-saving method is provided, so that a higher number of devices can be produced in shorter time.

Figure 4:
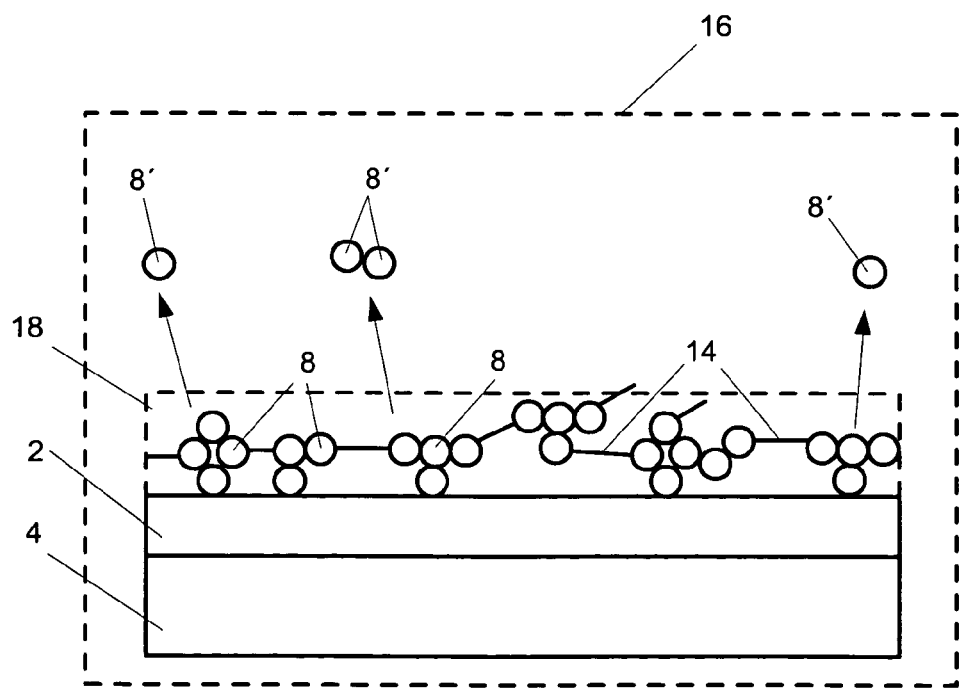
FIG. 4 is a schematic drawing illustrating the step of annealing the cross-linked molecular charge transfer material shown in FIG. 2 or 3.

Whichever approach is chosen, the irradiation does in most cases not lead to a completely cross-linked molecular charge transfer material 8. There typically still remain some molecules, which are not cross-linked with the others. Said molecules are indicated with reference signs 8' in FIGS. 2 and 3. If the device to be produced is an organic light-emitting diode (OLED), these molecules 8' would tend to migrate into the organic, light-emitting region of the OLED, so that the performance of the OLED is deteriorated, i.e. this migration results in a so-called quenching in the light-emitting region, so that the light emission efficiency of the OLED is decreased. In order to overcome this drawback a further step is performed comprising an annealing of the cross-linked molecular charge transfer material 8, as can be seen in FIG. 4. For this purpose, the first electrode 2 with the cross-linked molecular charge transfer material 8 deposited thereon is placed inside, a heat source like an oven 16. Inside the oven 16 there is a nitrogen atmosphere and the temperature is around 450° C., or a vacuum and a lower temperature, if a second layer of molecular charge transfer material on top of a stack of layers is annealed. As indicated by the arrows in FIG. 4, the annealing leads to an exhalation of the remaining loose molecules 8' and the first layer 18 of cross-linked molecular charge transfer material 8 is thereby improved. In an advantageous embodiment, the molecular charge transfer material 8 hence does contain substantially no molecules 8' that are not cross linked.

Figure 5:
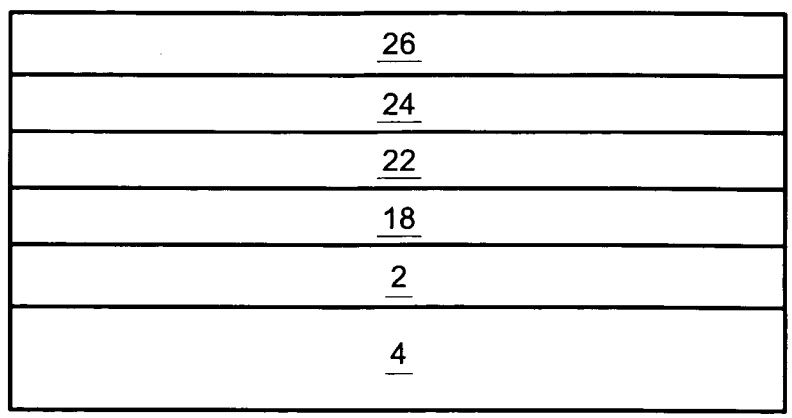
FIG. 5 is a schematic drawing illustrating an electronic device according to the invention.

In FIG. 5 there is shown an electronic device 20 according to the invention. The device 20 is an OLED and includes the substrate 4, the first electrode 2, which is used as an anode in the OLED, and the annealed first layer 18 of cross-linked molecular charge transfer material 8 as already described with reference to FIGS. 1 to 4. On the first layer 18 there is deposited a layer of organic material, referred to as organic layer 22, which acts as a light-emitting layer in which the charge carriers, i.e. holes and electrons, can recombine. The organic layer 22 may for example consist of Alq$_3$. A second layer 24 of cross-linked and annealed molecular charge transfer material is deposited on the organic layer 22 and on the second layer 24 of cross-linked and annealed molecular charge transfer material there is provided a second electrode 26, which is used as a cathode in the shown OLED. The first electrode 2 and the second electrode 26 with their layers 18, 24 of cross-linked and annealed molecular charge transfer material deposited thereon are substantially produced the same way as described with reference to FIGS. 1 to 4. However, the second layer 24 of cross-linked and annealed molecular charge transfer material comprises a donor. In the shown embodiment said donor is TTF. In contrast to this, the first layer 18 of cross-linked and annealed molecular charge transfer material comprises the acceptor F$_4$-TCNQ as already mentioned hereinbefore.

In FIGS. 6 to 9 there are shown different diagrams illustrating the properties of the devices according to the invention.

Figure 6:
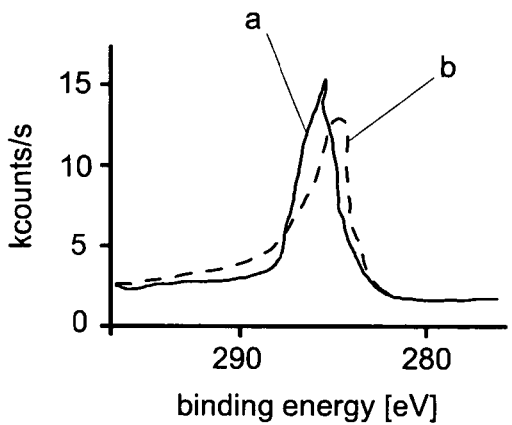
FIG. 6 is a diagram showing the C1s peak of the XPS spectra of a non-treated molecular charge transfer material (a) and a cross-linked molecular charge transfer material (b), both molecular transfer materials being $F_4$-TCNQ.

FIG. 6 shows the C1s peak of the XPS (X-Ray Photoelectron Spectroscopy) spectrum of a non-treated molecular charge transfer material consisting of F$_4$-TCNQ (a) and a cross-linked molecular charge transfer material consisting of F$_4$-TCNQ (b), respectively. The cross-linking has been performed by electron-beam irradiation, using here 500 eV, 100 μA, d=5 mm, t=10s. In both cases the thickness of the layers amounts to 100 Å. It is derivable from FIG. 6 that the cross-linking of the molecular charge transfer material results in a shift of the C1s peak in the XPS spectrum. Thus, X-Ray Photoelectron Spectroscopy is an appropriate investigation method for the layers of cross-linked molecular charge transfer material according to the invention. Especially, the degree of cross-linking may be investigated with XPS.

Figure 7:
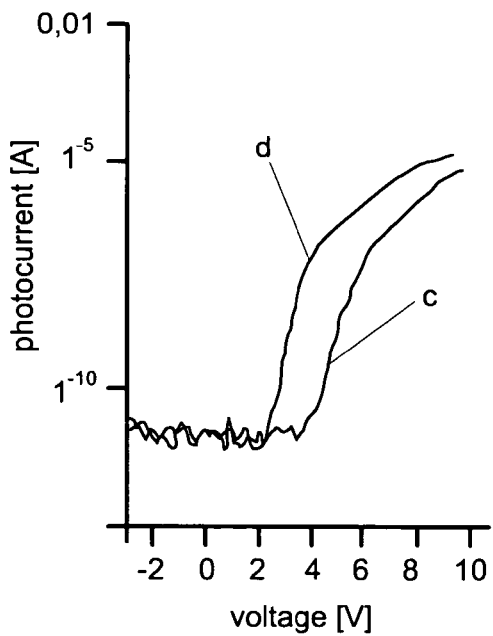
FIG. 7 is a diagram showing the intensity of light of an OLED having an anode with a cross-linked molecular charge transfer material deposited thereon (c) and an anode having a cross-linked molecular charge transfer material deposited thereon which has been annealed (d), respectively, depending on the operating voltage.

FIG. 7 shows a diagram illustrating the intensity of light of an OLED as for example shown in FIG. 5 having an anode with a cross-linked molecular charge transfer material consisting of F$_4$-TCNQ deposited thereon (c) and an anode having a cross-linked molecular charge transfer material consisting of F$_4$-TCNQ deposited thereon which has been annealed (d), respectively, depending on the operating voltage. In case (c), the measured photo current does not increase until an operating voltage of approximate 4V is achieved. In contrast to this, in case (d) the photo current already increases at an operating voltage of approximately 2V. From FIG. 7 it becomes apparent, that the annealing step provides for a lower operating voltage of the electronic device, like an OLED.

Figure 8:
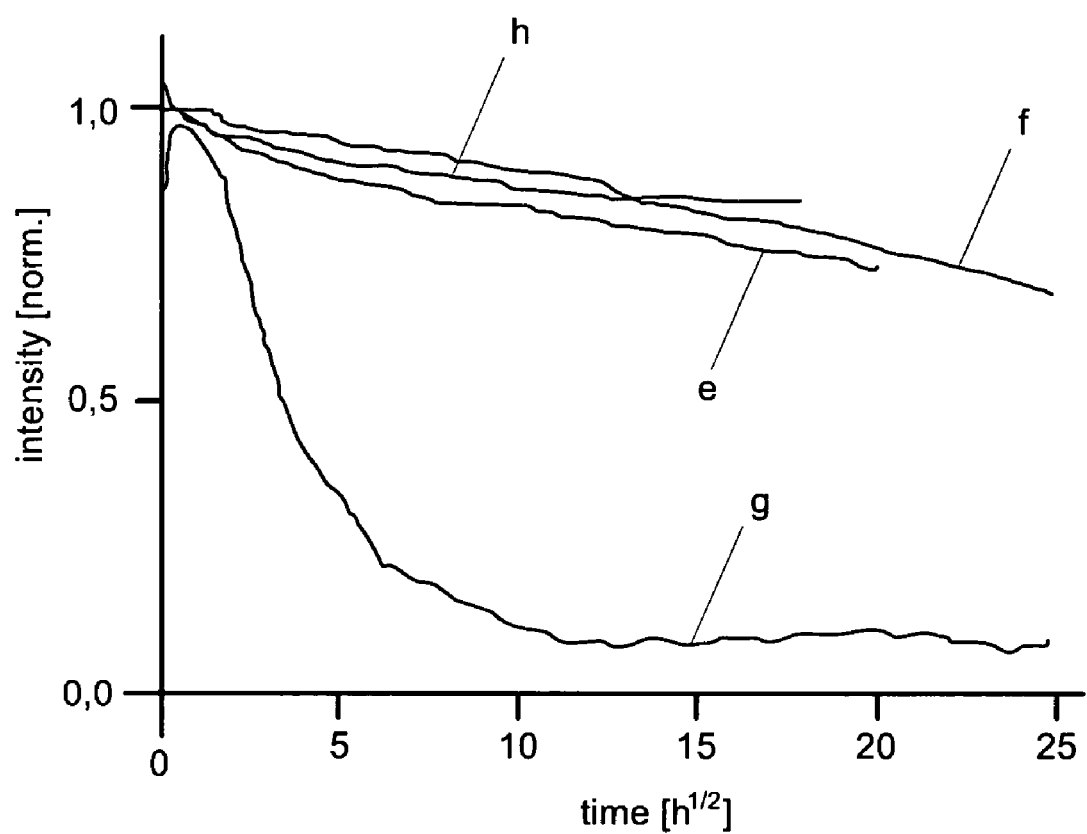
FIG. 8 is a diagram showing the intensity of an OLED having an anode with different treated or non-treated molecular charge transfer material layers of different thicknesses deposited thereon (e, f, g, and h) depending on the lifetime.

FIG. 8 shows a diagram illustrating the ageing process of an OLED, i.e. the decrease of the intensity of the OLED, depending on the lifetime. All samples were driven at 20 mA/cm$^2$, the molecular charge transfer material consisting of F$_4$-TCNQ.

In case (e), the molecular charge transfer material 8 has not been treated by cross-linking or annealing. In case (f), the molecular charge transfer material 8 has been cross-linked (electron-beam, t=70 min) and annealed (T=450° C., nitrogen atmosphere). In both cases (e) and (f), the thickness of the first layer 18 of the molecular charge transfer material 8 amounts to 5 Å. It becomes apparent from FIG. 8 that the OLED with a non-treated molecular charge transfer material 8 is subject to an accelerated ageing in contrast to the OLED produced according to the method of the invention, even though the difference is not that large. However, the advantage of the invention will especially become apparent, if a thicker first layer 18 of the molecular charge transfer material 8 is provided, as will be described hereinafter.

In case (g), the molecular charge transfer material 8 has not been treated by cross-linking or annealing. In case (h), the molecular charge transfer material 8 has been cross-linked (electron-beam, t=90 min) and annealed (T=450° C., nitrogen atmosphere). In contrast to the cases (e) and (f) described before, now the thickness of the first layer 18 of the molecular charge transfer material 8 amounts to 100 Å in both cases (g) and (h). It becomes apparent from FIG. 8 that the OLED with a common molecular charge transfer material 8 is subject to a much more accelerated ageing in contrast to the OLED produced according to the method of the invention, especially when a thicker first layer 18 of molecular charge transfer material is deposited on the first electrode 2. It is therefore a special advantage of the invention, that a thicker first layer 18 of molecular charge transfer material 8 could be produced without having an accelerated ageing and thus a loss of intensity of the OLED.

The invention claimed is:

1. A method for producing an electronic device having a first electrode comprising the steps of:
   providing the first electrode directly on a substrate,
   depositing a first layer of molecular charge transfer material directly on the first electrode, and cross-linking the molecular charge transfer material; and wherein said molecular charge transfer material is an acceptor, said acceptor is selected to consist of at least one of: TNF, TN9(CN)2F, TeNF, TCNB, DCNQ, and TCAQ.

2. A method according to claim 1, wherein the step of cross-linking of the molecular charge transfer material comprises irradiating the molecular charge transfer material with at least one of an electron-beam, UV irradiation, plasma or ion beam.

3. A method according to claim 1, wherein the steps of depositing and cross-linking of the molecular charge transfer material are performed within one single step.

4. A method according to claim 1, further comprising the step of annealing the cross-linked molecular charge transfer material.

5. A method according to claim 1, further comprising the step of depositing at least one organic layer on the first layer of the cross-linked molecular charge transfer material.

6. A method according to claim 5, further comprising the steps of: depositing a second layer of molecular charge transfer material on the organic layer, cross-linking the molecular charge transfer material of the second layer of molecular transfer material, and depositing a second electrode on the second layer of cross-linked molecular charge transfer material.

7. A method for producing an electronic device having a first electrode comprising the steps of:
providing the first electrode directly on a substrate,
depositing a first layer of molecular charge transfer material directly on the first electrode, and cross-linking the molecular charge transfer material; and
wherein said molecular charge transfer material is a donor, said donor is selected to consist of at least one of: Terpy, Ru(terpy)2, TTN, and crystal violet.

8. A method according to claim 7, wherein the step of cross-linking of the molecular charge transfer material comprises irradiating the molecular charge transfer material with at least one of an electron-beam, UV irradiation, plasma or ion beam.

9. A method according to claim 7, wherein the steps of depositing and cross-linking of the molecular charge transfer material are performed within one single step.

10. A method according to claim 7, further comprising the step of annealing the cross-linked molecular charge transfer material.

11. A method according to claim 7, further comprising the step of depositing at least one organic layer on the first layer of the cross-linked molecular charge transfer material.

12. A method according to claim 11, further comprising the steps of:
depositing a second layer of molecular charge transfer material on the organic layer, cross-linking the molecular charge transfer material of the second layer of molecular transfer material, and depositing a second electrode on the second layer of cross-linked molecular charge transfer material.

* * * * *